(12) United States Patent
Ferrant et al.

(10) Patent No.: US 6,798,681 B2
(45) Date of Patent: Sep. 28, 2004

(54) DRAM

(75) Inventors: Richard Ferrant, Esquibien (FR);
Pascale Mazoyer, Grenoble (FR);
Pierre Fazan, Le Landeron (CH)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/256,954

(22) Filed: Sep. 27, 2002

(65) Prior Publication Data

US 2003/0063505 A1 Apr. 3, 2003

(30) Foreign Application Priority Data

Sep. 28, 2001 (FR) ............................................ 01 12519

(51) Int. Cl.[7] .................................................. G11C 5/06
(52) U.S. Cl. .......................... 365/63; 365/51; 365/149
(58) Field of Search ............................ 365/51, 63, 145, 365/149, 189.02, 210; 257/296

(56) References Cited

U.S. PATENT DOCUMENTS

| | | | |
|---|---|---|---|
| 5,243,558 A | 9/1993 | Saeki | |
| 5,761,109 A | 6/1998 | Takashima et al. | |
| 5,886,943 A | 3/1999 | Sekiguchi | |
| 5,909,618 A | * 6/1999 | Forbes et al. | ................ 438/242 |
| 6,026,010 A | * 2/2000 | Ema et al. | ................... 365/149 |
| 6,084,307 A | 7/2000 | Keeth | |
| 6,538,950 B2 | * 3/2003 | Bohm et al. | ........... 365/230.02 |

OTHER PUBLICATIONS

French Search Report from French Patent Application No. 01/12519, filed Sep. 28, 2001.

* cited by examiner

*Primary Examiner*—Son Mai
(74) *Attorney, Agent, or Firm*—Lisa K. Jorgenson; William R. McClellan; Wolf, Greenfield & Sacks, P.C.

(57) ABSTRACT

A DRAM formed of an array of cells, each of which includes a capacitive memory point and a control transistor. The array is formed of the repetition of an elementary pattern extending over three rows and three columns and including six cells arranged so that each of the three rows and each of the three columns of the elementary pattern includes two cells, wherein each column of the elementary pattern includes a first and a second bit line, each first and second bit line being connected to one half of the memory cells included by the column.

6 Claims, 5 Drawing Sheets

DRAM

BACKGROUND OF THE INVENTION

1. Field of the Invention

The present invention generally relates to the field of semiconductor memories. More specifically, the present invention relates to high-density DRAMs.

2. Discussion of the Related Art

Generally, a DRAM is formed of an array of elementary cells placed at the intersection of rows or word lines and of columns or bit lines.

As illustrated in FIG. 1A, such an elementary memory cell is formed of a capacitive memory point (capacitor) MP and of an element T for controlling the memory point, generally a MOS transistor. The gate of transistor T is connected to a word line WL of the cell. The source or drain of control transistor T is in contact with a first electrode of memory point MP, the other electrode or plate of which is common to all the cells of at least one column and is biased to a very steady plate voltage VP. The drain or the source of control transistor T is connected to a bit line BL common to all the cells of a column.

As an example, as illustrated in the top view of FIG. 1B, it will be considered in the following description that the memory cells are formed by groups of two in active areas A of a semiconductor substrate. Each active area A is rectangular, its largest side being vertical, along the column axis. Two MOS transistors of the same type and dimensions are formed in active area A to have a common drain or source region. A bit line contact BLC is formed on this common drain or source region. Contact BLC is shown at the center of active area A by a cross in a square. The gate of each transistor runs on one side of contact BLC. These gates are insulated lines represented by hatched horizontal areas. Each one forms the word line of a cell. Each end of active area A corresponds to a source or drain region of each transistor in contact with an electrode of a memory point MP. Each memory point MP is represented by a square indicating contact MPC with the source or drain region and, around contact MPC, by a parallelogram in dotted lines symbolizing the capacitor surface.

Designating by F the smallest possible dimension for a conductive line, which is also called the minimum rule since it corresponds to a drawing rule imposed to the designer for a manufacturing technology, square $F^2$ of minimum rule F then being the minimum surface area or unity surface area of a pattern, elementary cells with a surface area four times as large as the unity surface area ($4F^2$) could theoretically be formed. In practice, the cells have a greater dimension generally on the order of eight times the unity surface area ($8F^2$).

To form DRAMs based on elementary cells identical to those in FIG. 1A, it has first been provided to repeat an elementary pattern formed of an elementary memory cell.

FIG. 2A schematically illustrates the arrangement of the DRAM thus obtained. In such an array, any intersection of a row $WL_j$, $WL_{j+1}$, $WL_{j+2}$ and of a column $BL_j$, $BL_{j+1}$, $BL_{j+2}$, $BL_{j+3}$ includes an elementary memory cell represented by a point. Each bit line $BL_j$, $BL_{j+1}$, $BL_{j+2}$, $BL_{j+3}$ is connected to an input of a respective sense amplifier $SA_j$, $SA_{j+1}$, $SA_{j+2}$, and $SA_{j+3}$. To enable reading, a second input of each amplifier SA is connected to a reference line RBL.

As illustrated in FIG. 2B, the forming in integrated form, in a semiconductor substrate of such an array then consists of repeating in the row (horizontal) direction as well as in the column (vertical) direction the structure described in relation with FIG. 1B.

A problem in this type of structure is the placing of sense amplifiers which require a width greater than that of a column. Another problem is the fact that the reference line(s) are independent from the bit lines and exhibit a noise which is not correlated with the noise therein.

To overcome these problems, a second type of memory such as illustrated in FIG. 3A has been provided, the elementary pattern of which extends over two rows and two columns and only includes two columns. Two adjacent bit lines of a same pattern respectively receive a signal and its complement. The two cells of a pattern are arranged so that each of the two rows and each of the two columns of the elementary pattern includes a single cell. As compared to an array of the first type described in relation with FIG. 2A, a row or a column of same dimension of an array of the second type includes half as many cells, an intersection out of two with a line or a row, respectively, being empty. Further, in the vertical direction, two adjacent patterns are arranged symmetrically. Thus, the word lines are arranged in order $WL_0$, $WL_1$, $WL_3$, $WL_2$ . . . $WL_{2k}$, $WL_{2k+1}$, $WL_{2k+3}$, $WL_{2k+2}$ . . .

FIG. 3B illustrates, in top view, the forming according to the technological process defined in FIG. 1B of a memory of the second type. More specifically, FIG. 3B illustrates the forming of the array portion including the intersections of the four rows $WL_{2k}$, $WL_{2k+1}$, $WL_{2k+3}$, $WL_{2k+2}$ and of the four columns $BL_t$, $\overline{BL_t}$, $BL_{t+1}$, and $\overline{BL_{t+1}}$ of FIG. 3A.

The elementary cells of a same column are aligned. However, from a given column $BL_t$ to the next one $\overline{BL_t}$, the active areas in each of which are formed two cells are shifted so that word lines $WL_{2k+1}$, $WL_{2k+3}$ of column $BL_t$ can cross the next column $\overline{BL_t}$ above an insulating area separating two active areas.

As illustrated in FIG. 3C, to enable passing between two active areas of two conductive lines $WL_{2k+1}$, $WL_{2k+3}$, while minimizing the bulk, rows (word lines) $WL_{2k}$, $WL_{2k+1}$, $WL_{2k+3}$, $WL_{2k+2}$ are given a zigzag shape. With this arrangement, the elementary cell of a memory of the second type exhibits a theoretical surface area of eight times the unity surface area ($8F^2$), in practice from ten to fourteen times said surface area.

Upon access to a cell of a given row $WL_{2k+1}$ at the intersection with a given bit line $BL_t$, the neighboring bit line $\overline{BL_t}$ for which the considered row $WL_{2k+1}$ includes no cell is used as a reference line. Conversely, for the preceding row $WL_{2k}$ or the next row $WL_{2k+2}$, upon access to the cell of this row placed at the intersection with bit line $\overline{BL_t}$, the neighboring bit line $BL_t$ is used as a reference bit line. Thus, each elementary column pair $BL_t$, $\overline{BL_t}$ or $BL_{t+1}$, $\overline{BL_{t+1}}$ of the array is connected to a sense amplifier $SA_t$, $SA_{t+1}$. There thus is one sense amplifier for two columns and no longer one per column as in the first type of memory.

Such a use as a reference bit line of a neighboring line enables in the first place recovering the surface area used in a memory of the first type by the reference line to form memory cells. In the second place, to form sense amplifiers of the same dimension, the space occupied by two columns instead of one in the case of an array of the first type is now available. Further, the number of sense amplifiers is reduced by half as compared to a memory of the first type. The column length can then be increased. In the third place, the fact of forming bit line $BL_t$, $\overline{BL_t}$, $BL_{t+1}$, $\overline{BL_{t+1}}$ and its corresponding reference line $\overline{BL_t}$, $BL_t$, $\overline{BL_{t+1}}$, $BL_{t+1}$ in a same array enables them to have a correlated noise. The densities and access performances of memories of the second type are thus improved with respect to memories of the first type.

A problem with this type of structure is that, as technology advances, as the dimensions of elementary cells and of the metallizations forming the word lines are reduced, it becomes impossible to form zigzag lines such as shown in FIG. 3C. A design of the type of that in FIG. 3B must thus be used again and the theoretical space gain resulting from the reduction in line dimensions is lost.

SUMMARY OF THE INVENTION

The present invention accordingly aims at providing a DRAM which combines the advantages of memories of the first type and of the second type.

The present invention aims at providing such a memory in which the elementary cells exhibit dimensions as close as possible to those of the cells of a memory of the first type.

The present invention also aims at providing such a memory having an increased density as compared to a memory of the second type.

The present invention also aims at providing such a memory having an access (read/write) reliability which is at least equal to that of a memory of the second type.

The present invention also aims at providing such a memory wherein the capacitive coupling between lines is reduced.

The present invention also aims at providing such a memory of simple manufacturing.

To achieve these and other objects, the present invention provides a DRAM formed of an array of cells, each of which includes a capacitive memory point and a control transistor, the array being formed of the repetition of an elementary pattern extending over three rows and three columns and including six cells arranged so that each of the three rows and each of the three columns of the elementary pattern includes two cells. Each column of the elementary pattern includes a first and a second bit line, each first and second bit line being connected to one half of the memory cells included by the column.

According to an embodiment of the present invention, at least one of the ends of the group of three columns of the elementary pattern is connected to a read device for selecting, based on the address of a cell, the bit line including the cell and the corresponding reference line.

According to an embodiment of the present invention, the read device includes access means for selecting, based on the address of the row including the addressed cell, the two bit lines that include the cell and at last one corresponding reference line and a means for validating the output of that of the access means enabling access to the bit line including the addressed cell.

According to an embodiment of the present invention, the access means include a sense amplifier and a multiplexer.

According to an embodiment of the present invention, for an addressed cell, the reference line is that of the first and second bit lines which is not connected to said addressed cell.

According to an embodiment of the present invention, the first and second bit lines altogether take up three metallization levels, each of the first and second bit lines partially taking up the first and third ones of the three levels, the crossings occurring via the second one of the three levels.

The foregoing objects, features and advantages of the present invention, will be discussed in detail in the following non-limiting description of specific embodiments in connection with the accompanying drawings.

DETAILED DESCRIPTION

For clarity, the same elements are designated with the same references in the different drawings. Further, as usual in the representation of integrated circuits, the various drawings are not drawn to scale.

Figure 1A:
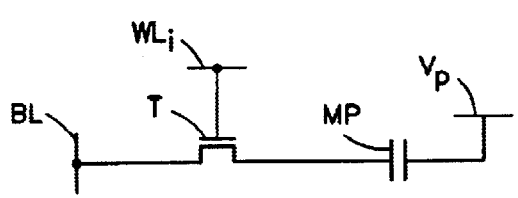
FIG. 1A is an equivalent electric diagram of an elementary cell of a DRAM.
Figure 1B:
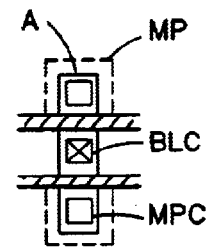
FIG. 1B is a partial simplified top view of an example of embodiment of the cell of FIG. 1A in a semiconductor substrate.
Figure 2A:
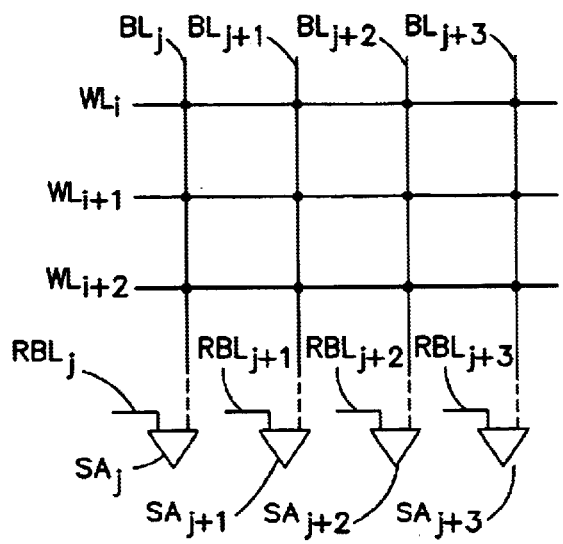
FIGS. 2A and 2B schematically and partially illustrate a DRAM of a first known type.
Figure 2B:
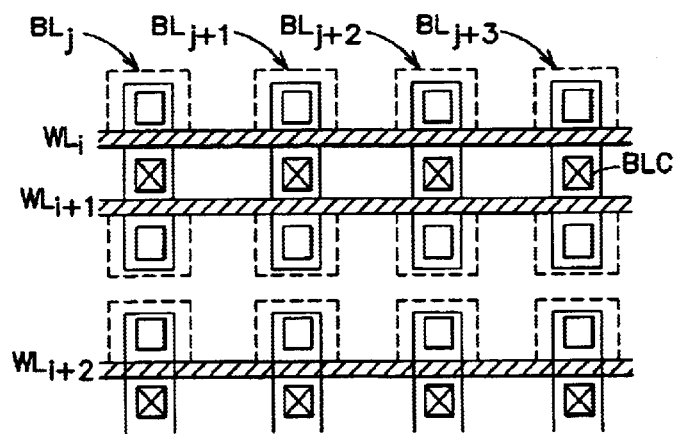
Figure 3B:
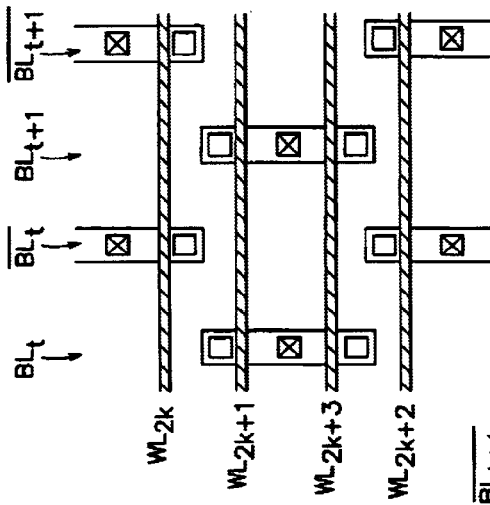
FIGS. 3A to 3C schematically and partially illustrate a DRAM of a second known type.
Figure 3C:
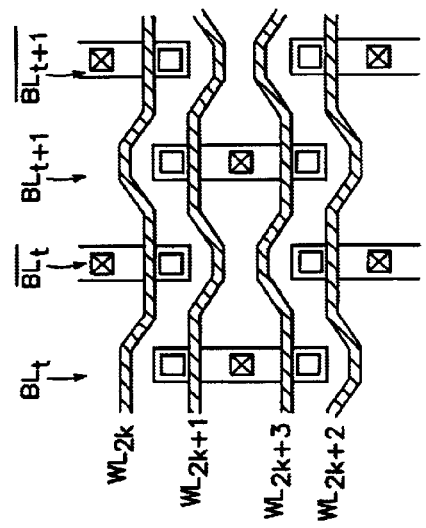
Figure 3A:
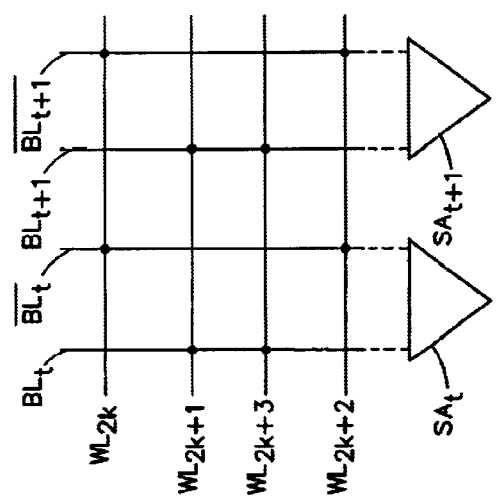
Figure 4A:
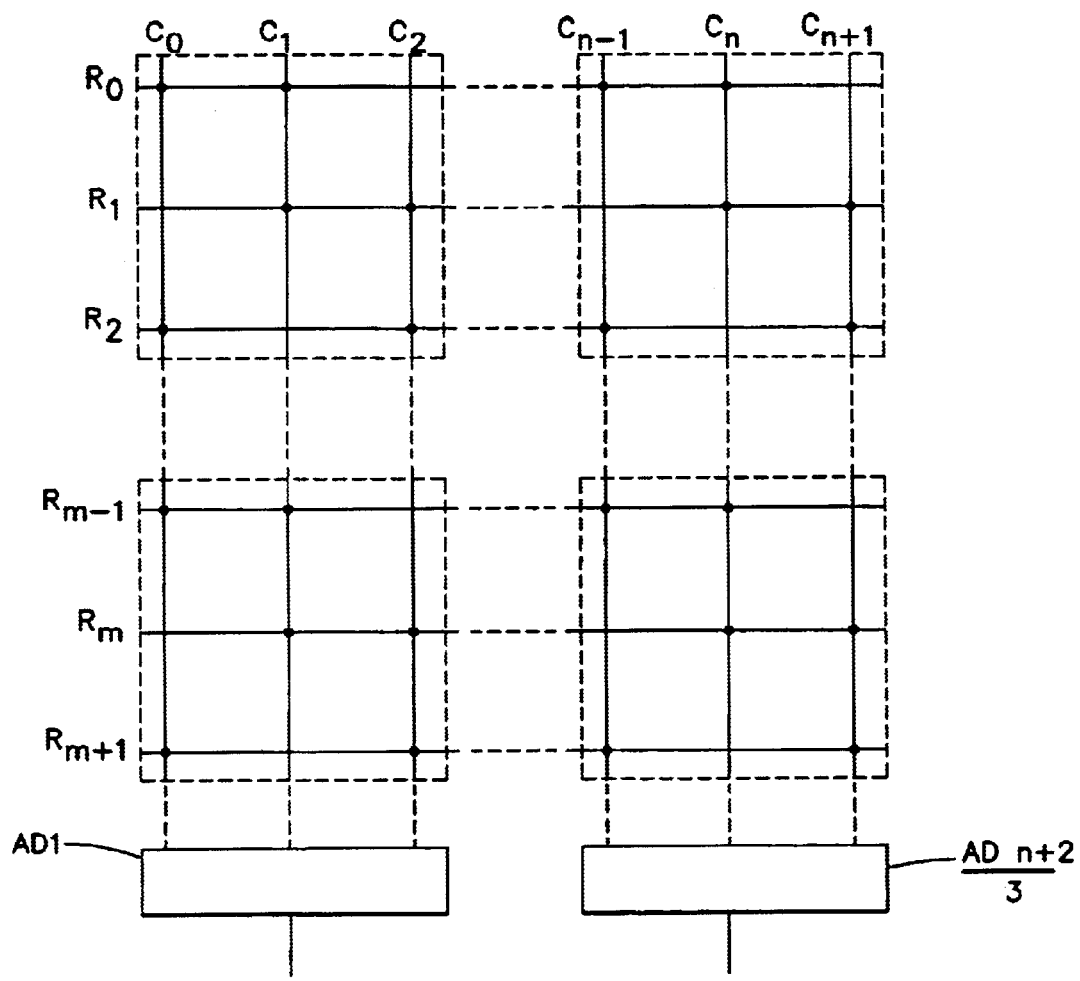
FIGS. 4A and 4B schematically and partially illustrate a DRAM according to the present invention.
Figure 4B:
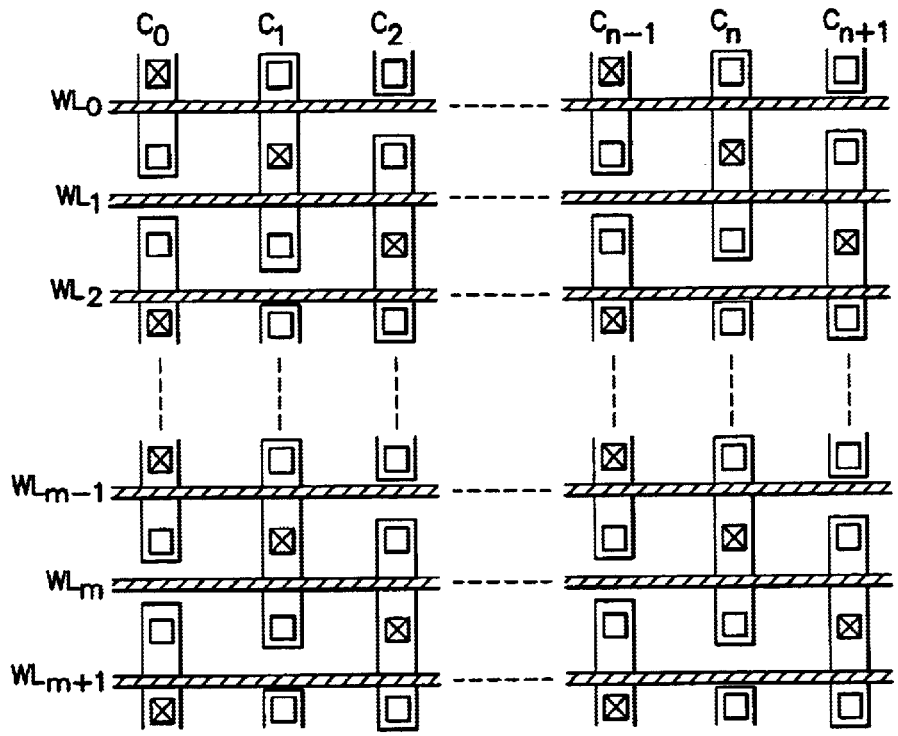

FIG. 4A schematically illustrates in top view the array arrangement of elementary cells in a DRAM according to the present invention. FIG. 4B schematically illustrates, in a partial simplified top view, a portion of a memory array according to the present invention formed in a semiconductor substrate. For clarity, the same portion of the memory array as in FIG. 4A has been shown in FIG. 4B. It has also been considered as a non-limiting example that the technological process used to form the memory according to the present invention is similar to that described in relation with FIG. 1B and already used to describe the forming of a memory of the first type (FIG. 2B) or of the second type (FIG. 3B).

A memory according to the present invention is formed of the repeating of a specific elementary pattern framed in dotted lines in FIG. 4A. The elementary pattern according to the present invention includes six elementary memory cells distributed at the intersections of the rows and columns so that each of the three rows $R_0$-$R_1$-$R_2$ and $R_{m-1}$-$R_m$-$R_{m+1}$ and each of the three columns $C_0$-$C_1$-$C_2$ and $C_{n-1}C_n$-$C_{n+1}$ of the elementary pattern only includes two cells. The pattern according to the present invention includes six elementary memory cells distributed at the intersections of rows $R_0$-$R_1$-$R_2$ and $R_{m-1}$-$R_m$-$R_{m+1}$ and each of the three columns $C_0$-$C_1$-$C_2$ and $C_{n-1}$-$C_n$-$C_{n+1}$ of the elementary pattern only includes two cells. It is assumed, as a non-limiting example that first row $R_0$, $R_{m-1}$ of the pattern includes a cell at the intersections with first and second columns $C_0$ and $C_1$ or $C_{n-1}$ and $C_n$ and none at the intersection with third column $C_2$ or $C_{n+1}$. Similarly, second row $R_1$, Rm of the pattern includes a cell at the intersections with the second and third columns $C_1$ and $C_2$ or $C_n$ and $C_{n+1}$ and none at the intersection with the first column $C_0$ or $C_{n-1}$. The third row $R_2$, $R_{m+1}$ includes a cell at the intersections with the first and third columns $C_0$ and $C_2$ or $C_{n-1}$ and $C_{n+1}$ and none at the intersection with the second column $C_1$ or $C_n$. Each elementary group of three columns $C_0$, $C_1$, $C_2$ or $C_{n-1}$, $C_n$, $C_{n+1}$ is connected to a read device AD1, AD[(n+2)/3].

As illustrated in FIG. 4B, this structure is formed in a semiconductor substrate by associating with each row R a word line WL. In the following description, references $R_0$, $R_1$, $R_2$, $R_{m-1}$, $R_m$ and $R_{m+1}$ of the rows will be referred to with references $WL_0$, $WL_1$, $WL_2$, $WL_{m-1}$, $WL_m$, and $WL_{m+1}$ of the word lines. A single word line WL must then pass between two active areas of one column out of three. On a given column $C_0$, $C_1$, $C_2$ of an elementary pattern are aligned elementary memory cells similar to the cell of FIG. 1B. In accordance with the arrangement described in relation with FIG. 4A, a first word line $WL_0$ is then common to the two first columns $C_0$ and $C_1$, but not to the next column $C_2$. The next word line $WL_1$ is common to the second and third columns $C_1$ and $C_2$. The third word line $WL_2$ is common to the first and third columns $C_0$ and $C_2$. Then, with respect to central column $C_1$, the cells of the neighboring columns $C_0$, $C_2$ are respectively shifted upwards and downwards (or conversely). Thus, the first word line $WL_0$ successively runs between a bit line contact and a memory point, between a memory point and a bit line contact, and above a field insulation separating two cell forming areas.

The next word line $WL_1$ crosses column $C_0$ between two active regions, column $C_1$ between a bit line contact and a memory point, and column $C_2$ between a memory point and a bit line contact. The third word line $WL_2$ crosses column $C_0$ between a memory point and a bit line contact, central column $C_1$ above an insulating region separating two active areas, and third column $C_2$ between a bit line contact and a memory point.

This arrangement is then repeated according to the previously-described distribution.

According to the arrangement of the present invention, two memory points close to two neighboring cells are separated by a single word line. The word line may then be rectilinear, perpendicular to all columns. The maximum surface occupied by a cell can then be brought down to minimum standard dimensions, theoretically on the order of six times the unity surface area ($6F^2$). In practice, the real dimensions may be very close to this theoretical value. The memory array can thus be formed at least as densely as the memory of the first type.

The forming of a memory according to the present invention seems to come along with a complication of the read devices (sense amplifier and multiplexer). However, on the one hand, the number of read circuits is reduced to one third of the necessary number for an array of the first type or to two thirds of the necessary number for an array of the second type. On the other hand, an increased surface area corresponding to three columns is available to form each of these. Thus, the bulk increase of the read circuit is greatly compensated for by the reduction in cell dimensions and the relative increase in the surface area available between two less numerous neighboring read circuits. In a chip with a standard surface area of a few mm2, a memory of two million memory points will be formed according to the present invention, against twenty thousand only for a memory of the first type. As compared to a memory of the second type, the surface gain is on the order of three.

Figure 5:
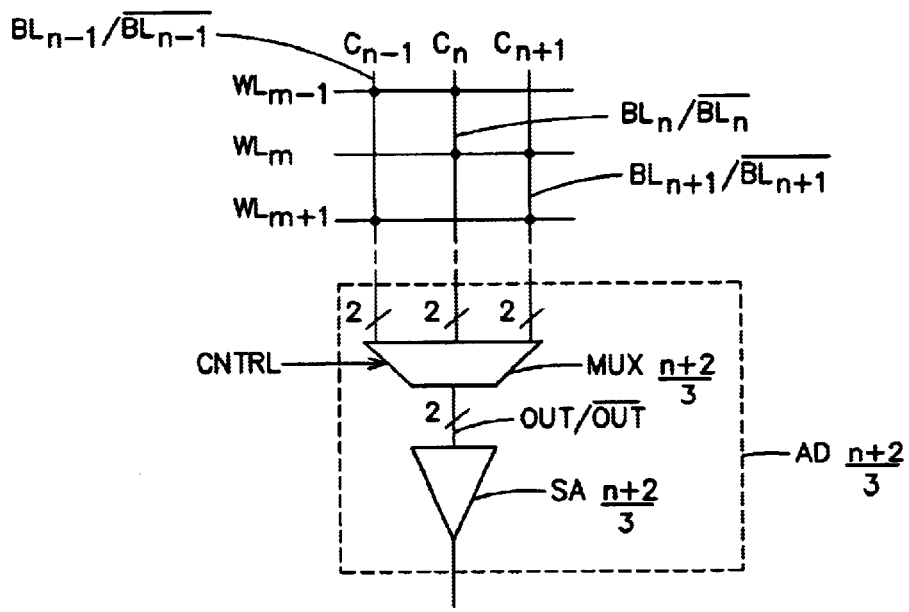
FIG. 5 schematically illustrates a portion of the memory of FIG. 4 according to an aspect of the present invention.

According to an aspect of the present invention, illustrated in FIG. 5, each column $C_{n-1}$, $C_n$, $C_{n+1}$ of the elementary pattern includes two complementary bit lines $BL_{n-1}/\overline{BL}_{n-1}$, $BL_n/\overline{BL}_n$, and $BL_{n+1}/\overline{BL}_{n+1}$. The two bit lines $BL_n$, $\overline{BL}_n$ of a given column $C_n$ are formed so that each of them is connected to a single half of the cells of the considered column $C_n$ and that each cell is connected to a single bit line $BL_n$ or $\overline{BL}_n$. Upon access in column $C_n$ to a cell connected to bit line $BL_n$ or $\overline{BL}_n$, the other line $\overline{BL}_n$ or $BL_n$ can then advantageously be used as a reference line. The corresponding read device AD[(n+2)/3] includes a sense amplifier SA[(n+2)/3] and an input multiplexer MUX[(n+2)/3]. Multiplexer MUX[(n+2)/3] of read device AD[(n+2)/3] connected to the corresponding elementary group of three columns $C_{n-1}$, $C_n$, $C_{n+1}$ receives as an input the six bit lines grouped by pairs of complementary lines $BL_{n-1}/\overline{BL}_{n-1}$, $BL_n/\overline{BL}_n$, and $BL_{n+1}/\overline{BL}_{n+1}$. Multiplexer MUX[(n+2)/3] includes the two outputs OUT and $\overline{\text{OUT}}$ as well as a control terminal CNTRL which receives the cell addressing orders to select the appropriate bit line and reference line. By using as the reference bit line a line of the memory array, the signal-to-noise ratio is improved, as in the case of a memory of the second type.

Figure 6:
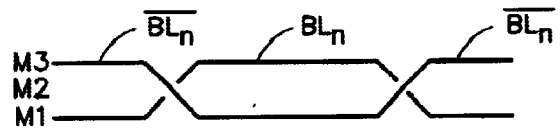
FIG. 6 illustrates in a simplified partial cross-section view a portion of a column of the memory of FIG. 5 according to an embodiment of the present invention.
Figure 7:
FIG. 7 illustrates in a simplified partial cross-section view a portion of a column of the memory of FIG. 5 according to another embodiment of the present invention.

Made in integrated form, the bit lines $BL_n/\overline{BL}_n$ of a column $C_n$ are superposed, as illustrated in FIGS. 6 and 7. FIGS. 6 and 7 are partial simplified cross-section views of a memory similar to the memory described in relation with FIG. 5. The cross-section views of FIGS. 6 and 7 are made along the axis of a column $C_n$ of the array.

Bit lines $BL_n$ and $\overline{BL}_n$ of the considered column $C_n$ are made simultaneously in two distinct lower and upper metallization levels $M_1$ and $M_3$, preferably separated by an intermediary level $M_2$ in which they cross. Each of lines $BL_n$, $\overline{BL}_n$ is connected in the lower metallization level $M_1$ to half of the cells of column $C_n$.

The dividing in two halves of the cells of a column $C_n$ may be performed, as illustrated in FIG. 6, so that line $BL_n$ extends on lower level $M_1$ of the beginning of column $C_n$ to reach the first quarter of the column, then runs into upper level $M_3$ to reach the three quarters of the columns and returns to lower level $M_1$ on the last quarter of the column. Complementarily, bit line $\overline{BL}_n$ runs into upper level $M_3$ on the first quarter of the column, on lower level $M_1$ from the quarter to the three quarters of the column, and returns on upper level $M_3$ for the last quarter.

According to an alternative illustrated in FIG. 7, line $BL_n$ extends on lower level $M_1$ on a first half of the column, then passes on upper level $M_3$ for the second half of the column, and conversely for complementary bit line $\overline{BL}_n$.

Preferably, in an array according to the present invention, the patterns of FIGS. 6 and 7 alternate from one column to the other. Such an alternation advantageously enables avoiding or reducing and balancing any possible parasitic coupling in any metallization level $M_1$, $M_2$, or $M_3$. This improves the performances of access to a cell of the memory according to the present invention by reducing and homogenizing the column noise.

It has been considered up to now that each group of three columns is connected to an access device including a sense amplifier and a multiplexer. Upon access to a given cell, the selection of the bit line and of the reference line (two superposed bit lines assigned to the column including the addressed cell) is performed by providing the multiplexer with the address of the selected cell.

Figure 8:
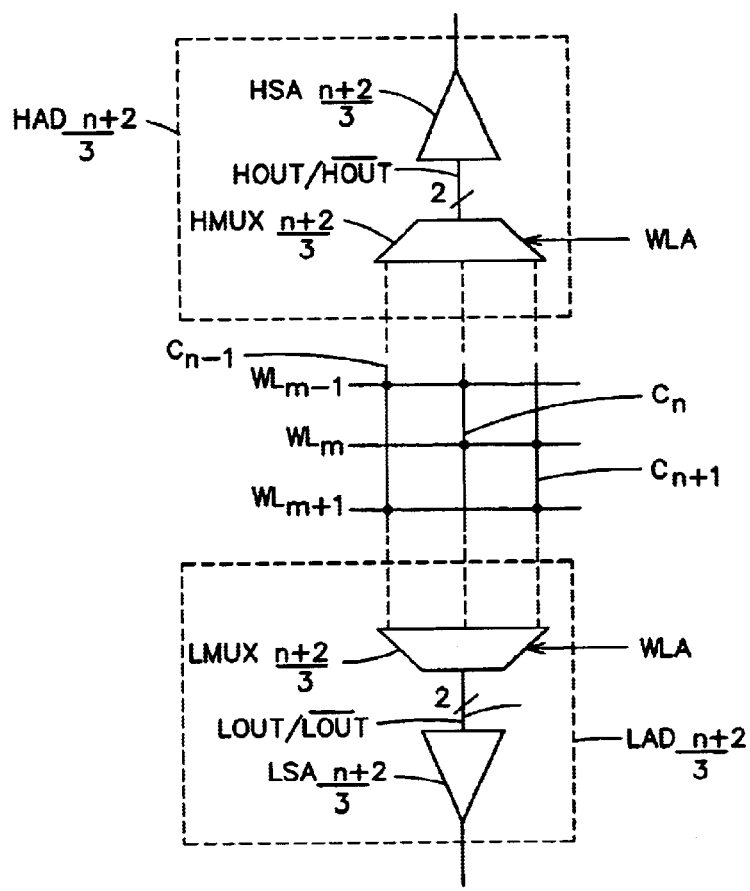
FIG. 8 illustrates the association of a portion of the memory of FIG. 4 with several read devices according to an embodiment of the present invention.

As illustrated in FIG. 8, according to a preferred embodiment of the present invention, two read devices HAD[(n+2)/3] and LAD[(n+2)/3] will be provided for each elementary group of three columns $C_{n-1}$, $C_n$, $C_{n+1}$. Each of devices HAD[(n+2)/3] and LAD[(n+2)/3] is placed at a high or low end of the columns, respectively. Multiplexers HMUX[(n+2)/3] and LMUX[(n+2)/3] are then designed so that each corresponding sense amplifier HSA[(n+2)/3], LSA[(n+2)/3] has access, from the sole address WLA of a word line $WL_m$, to one of the two columns $C_n$ or $C_{n+1}$ likely, for the considered row, to include the addressed cell. For each column $C_n$, $C_{n+1}$, the corresponding sense amplifier HSA [(n+2)/3], LSA[(n+2)/3] has access to a bit line BL likely to be connected to the cell and to the corresponding reference line RBL.

For example, based on word line $WL_m$, with the structure of FIG. 5 with two bit lines per column, high read device HAD[(n+2)/3] will for example enable access to the two complementary bit lines $BL_n/\overline{BL}_n$ of column $C_n$, while low read device ADL[(n+2)/3] will enable access to complementary lines $BL_{n+1}/\overline{BL}_{n+1}$ of column $C_{n+1}$.

Then, that of amplifiers HSA[(n+2)/3], LSA[(n+2)/3] enabling access to the addressed cell is validated based on the address of the bit line connected to the addressed cell.

Such an implementation by means of two read devices HAD (HMUX, HSA) and LAD (LMUX, LSA) has two major advantages. On the one hand, it simplifies the structure and control of the individual multiplexers with respect to a single multiplexer. On the other hand, access is generally had to a cell of a DRAM by first selecting the corresponding row, then the corresponding column. The simultaneous pre-selection of the two possible bit lines and of their reference can be performed during the latency time separating the row selection and the column selection. Thus, such an access to an addressed cell is not slowed down with respect to a standard memory of the first or second type.

The present invention is likely to have various alterations, modifications, and improvements which will readily occur to those skilled in the art. In particular, all structure elements specific to a considered technological process may be appropriately modified according to the teachings of the present invention. Thus, it has been considered in the foregoing description that two elementary cells of a same column are formed in a same active area of a semiconductor substrate, the control element of each cell being a lateral transistor, the bit line and the memory point being formed on the substrate surface on either side of an insulated line also formed on the substrate and forming the word line. However, the present invention could also be applied to elementary cells, each formed in an individual active area, the control element then being a vertical MOS transistor, the gate of which is formed in a trench, the first electrode of the memory point or/and the bit line contact being also formed in the trench.

It has been previously assumed that the two superposed complementary bit lines are formed on three successive metallization levels. It should however be noted that they could be formed on two levels only or on more than three levels. Preferably, the intermediary levels are then only used, as concerns the bit lines, to perform the crossings.

Similarly, only complementary bit lines have been shown on the metallization levels in FIGS. 6 and 7. However, the metallization levels may include any appropriate element. Thus, in the considered example of three metallization levels, the intermediary level, in addition to the bit crossings, may include the word lines.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A DRAM formed of an array of cells, each of which includes a capacitive memory point and a control transistor, the array being formed of the repetition of an elementary pattern extending over three rows and three columns and including six cells arranged so that each of the three rows and each of the three columns of the elementary pattern includes two cells, wherein each column of the elementary pattern includes a first and a second bit line, each first and second bit line being connected to one half of the memory cells included by the column.

2. The method of claim 1, wherein at least one of the ends of the group of three columns of the elementary pattern is connected to a read device for selecting, based on the address of a cell, the bit line which includes the cell, and a corresponding reference line.

3. The memory of claim 2, wherein the read device includes access means for selecting, based on the address of the row including the addressed cell, the two bit lines that include the cell and at least one corresponding reference line and a means for validating the output of that of the access means enabling access to the bit line including the addressed cell.

4. The memory of claim 3, wherein the access means include a sense amplifier and a multiplexer.

5. The memory of claim 1, wherein for an addressed cell, a reference line is that of the first and second bit lines which is not connected to said addressed cell.

6. The memory of claim 1, wherein the first and second bit lines altogether take up three metallization levels, each of the first and second bit lines partially taking up the first and third ones of the three levels, the crossings occurring via the second one of the three levels.

* * * * *